US011117807B2

(12) United States Patent
Zhou

(10) Patent No.: US 11,117,807 B2
(45) Date of Patent: Sep. 14, 2021

(54) METHOD OF MAKING ALUMINUM-FREE NEOPENTASILANE

(71) Applicant: Jiangsu Nata Opto-Electronic Materials Co. Ltd., Jiangsu (CN)

(72) Inventor: Xiaobing Zhou, Midland, MI (US)

(73) Assignee: JIANGSU NATA OPTO-ELECTRONIC MATERIALS CO. LTD., Jiangsu Province (CN)

(*) Notice: Subject to any disclaimer, the term of this patent is extended or adjusted under 35 U.S.C. 154(b) by 0 days.

(21) Appl. No.: 16/004,802

(22) Filed: Jun. 11, 2018

(65) Prior Publication Data
US 2018/0370807 A1 Dec. 27, 2018

Related U.S. Application Data

(60) Provisional application No. 62/524,078, filed on Jun. 23, 2017.

(51) Int. Cl.
| | |
|---|---|
| *C01B 33/027* | (2006.01) |
| *C23C 16/40* | (2006.01) |
| *C01B 33/04* | (2006.01) |
| *C23C 16/34* | (2006.01) |
| *C23C 16/455* | (2006.01) |
| *C01B 6/24* | (2006.01) |
| *C09D 1/00* | (2006.01) |
| *C23C 16/50* | (2006.01) |

(52) U.S. Cl.
CPC ............ *C01B 33/046* (2013.01); *C01B 6/243* (2013.01); *C01B 33/027* (2013.01); *C01B 33/04* (2013.01); *C09D 1/00* (2013.01); *C23C 16/345* (2013.01); *C23C 16/401* (2013.01); *C23C 16/45536* (2013.01); *C23C 16/45553* (2013.01); *C23C 16/50* (2013.01)

(58) Field of Classification Search
CPC . C23C 16/401; C23C 16/45553; C23C 16/50; C01B 33/027; C01B 33/04; C01B 33/046; C09D 1/00
See application file for complete search history.

(56) References Cited

U.S. PATENT DOCUMENTS

| | | | | |
|---|---|---|---|---|
| 8,147,789 | B2* | 4/2012 | Cannady | C01B 33/04 |
| | | | | 423/345 |
| 8,795,613 | B2 | 8/2014 | Troegel | |
| 9,926,203 | B2* | 3/2018 | Zhou | C01B 33/04 |
| 2010/0176338 | A1 | 7/2010 | Cannady et al. | |
| 2012/0071678 | A1* | 3/2012 | Arkles | C07F 17/02 |
| | | | | 556/11 |
| 2012/0214006 | A1* | 8/2012 | Chen | C09D 183/16 |
| | | | | 428/447 |
| 2013/0259791 | A1 | 10/2013 | Brausch et al. | |
| 2014/0004357 | A1* | 1/2014 | Zhou | H01L 21/02164 |
| | | | | 428/446 |
| 2014/0213070 | A1* | 7/2014 | Hong | H01L 21/02337 |
| | | | | 438/778 |
| 2016/0276150 | A1* | 9/2016 | Xue | H01L 21/02274 |
| 2017/0129908 | A1* | 5/2017 | Rekken | H01L 21/0262 |
| 2018/0076025 | A1* | 3/2018 | Zhou | H01L 21/02274 |
| 2019/0376187 | A1* | 12/2019 | Noda | C23C 16/56 |

FOREIGN PATENT DOCUMENTS

CN 1297471 A * 5/2001 .......... H01L 21/205

OTHER PUBLICATIONS

Sturm, J.C., et al., "Chemical Vapor Deposition Epitaxy of Silicon-based Materials using Neopentasilane". ECS Transactions, 16 (10), pp. 799-805, 2008.*
Weeks, Stephen, et al., "Plasma enhanced atomic layer deposition of silicon nitride using neopentasilane". Journal of Vacuum Science & Technology A 34(1), Jan./Feb. 2016, 01A140-1 to 01A140-6.*
Lu, Xiaotang, et al., "Low Temperature Colloidal Synthesis of Silicon Nanorods from Isotetrasilane, Neopentasilane, and Cyclohexasilane". Chem. Mater. 2015, 27, 17, 6053-6058.*
Kampken, Britta, et al., "Directed deposition of silicon nanowires using neopentasilane as precursor and gold as catalyst". Beilstein J Nanotechnol. 2012; 3: 535-545.*
Jin Park, Sung, et al., "New Condensation Polymer Precursors Containing Consecutive Silicon Atoms—Decaisopropoxycyclopentasilane and Dodecaethoxyneopentasilane—And Their Sol-Gel Polymerization". Polymers (Basel). May 2019; 11(5): 841, pp. 1-14.*
Chung, K. H., et al., "Ultrahigh growth rate of epitaxial silicon by chemical vapor deposition at low temperature with neopentasilane". Appl. Phys. Lett. 92, 113506 (2008) pp. 1-3. https://doi.org/10.1063/1.2897325.*
Sturm, J.C., et al., "Chemical Vapor Deposition Epitaxy of Silicon-based Materials using Neopentasilane". pp. 1-7. No citation information nor date available.*
Sturm, et al, "Chemical vapor deposition epitaxy of silicon-based materials using neopentasilane", ECS Transactions, Jan. 2008, pp. 799-805, vol. 16.
Search report for corresponding Europe Application No. 18 17 9116 dated Aug. 17, 2018.

* cited by examiner

*Primary Examiner* — Bret P Chen
(74) *Attorney, Agent, or Firm* — Morgan, Lewis & Bockius LLP

(57) ABSTRACT

A method of making neopentasilane, the method comprising:
contacting perchloroneopentasilane with a reductive effective amount of an alkali metal aluminum hydride in an alkylaluminum compound of formula $R_xAlCl_{3-x}$, where R is alkyl having from at least 5 carbon atoms, x is an integer from 1 to 3, and the alkylaluminum compound has a boiling point of at least 250° C., at conditions sufficient to reduce the perchloroneopentasilane, to form a reaction product mixture comprising neopentasilane, and separating the neopentasilane from the product mixture to form a neopentasilane isolate.

10 Claims, No Drawings

METHOD OF MAKING ALUMINUM-FREE NEOPENTASILANE

CROSS-REFERENCE TO RELATED APPLICATIONS

None.

BACKGROUND OF THE INVENTION

Neopentasilane (NPS) has been demonstrated to be a promising precursor for depositing silicon-containing films in chemical vapor deposition (CVD) processes.

NPS has been made in good yield by reducing perchloroneopentasilane (NPC), $Si(SiCl_3)_4$, with diisobutylaluminum hydride (DIBAH) to form NPS and diisobutylaluminum chloride (DIBAC). However, aluminum compounds are unwanted impurities in NPS produced by this process. In particular, aluminum impurities are unwanted in CVD processes for electronics applications. Attempts to remove the aluminum impurities by conventional means have been inadequate.

Low or reduced aluminum content NPS has been produced by treating NPS produced by reducing NPC with DIBAH with Lewis bases; however, Lewis bases can catalyze degradation of NPS and reduce yields. Furthermore, Lewis base treatment only reduces, but does not eliminate, aluminum from the NPS produced with this process.

NPS has also been made by the reduction of NPC with lithium aluminum hydride in diethyl ether or diisobutylaluminum chloride. However, reduction in diethyl ether requires very low temperatures and produces NPS in low yield. Furthermore, the NPS produced by reduction in DIBAC also contains aluminum impurities that are difficult to remove.

Therefore, there is a need for new methods of making NPS by reduction with an aluminum hydride that reduce aluminum impurities in the NPS produced, that reduce the steps required to isolate reduced-aluminum NPS, and that produce NPS in good yield.

BRIEF SUMMARY OF THE INVENTION

The present invention is directed to a method of making neopentasilane, the method comprising contacting perchloroneopentasilane with a reductive effective amount of an alkali metal aluminum hydride in an alkylaluminum compound of formula $R_xAlCl_{3-x}$, where R is alkyl having from at least 5 carbon atoms, x is an integer from 1 to 3, and the alkylaluminum compound has a boiling point of at least 250° C., at conditions sufficient to reduce the perchloroneopentasilane, to form a reaction product mixture comprising neopentasilane, and separating the neopentasilane from the product mixture to form a neopentasilane isolate.

The present invention is further directed to a method of depositing a silicon-containing film on a substrate, the method comprising, introducing neopentasilane produced by contacting perchloroneopentasilane with a reductive effective amount of an alkali metal aluminum hydride in an alkylaluminum compound of formula $R_xAlCl_{3-x}$, where R is alkyl having from at least 5 carbon atoms, x is an integer from 1 to 3, and the alkylaluminum compound has a boiling point of at least 250° C., at conditions sufficient to reduce the perchloroneopentasilane, to form a reaction product mixture comprising neopentasilane, and separating the neopentasilane from the product mixture to form a neopentasilane isolate, into a reactor with a substrate and, optionally, additional reactants under deposition sufficient conditions to form a silicon-containing film on the substrate.

The method of the invention produces neopentasilane in good yield and comprising low or no detectable amount of aluminum.

DETAILED DESCRIPTION OF THE INVENTION

A method of making neopentasilane, the method comprising:

contacting perchloroneopentasilane with a reductive effective amount of an alkali metal aluminum hydride in an alkylaluminum compound of formula $R_xAlCl_{3-x}$, where R is alkyl having at least 5 carbon atoms, x is an integer from 1 to 3, and the alkylaluminum compound has a boiling point of at least 250° C., at conditions sufficient to reduce the perchloroneopentasilane, to form a reaction product mixture comprising neopentasilane, and separating the neopentasilane from the reaction product mixture to form a neopentasilane isolate.

The perchloroneopentasilane is contacted with a reductive effective amount of an alkali metal aluminum hydride in an alkylaluminum compound of formula $R_xAlCl_{3-x}$, where R is alkyl having at least 5 carbon atoms, x is an integer from 1 to 3, and the alkylaluminum compound has a boiling point of at least 250° C., at conditions sufficient to reduce the perchloroneopentasilane, to form a reaction product mixture comprising neopentasilane.

Perchloroneopentasilane is $Si(SCl_3)_4$ and is available commercially.

The alkali metal of the alkali metal aluminum hydride is lithium, sodium, potassium, alternatively lithium. Examples of the alkali metal aluminum hydride include lithium aluminum hydride and sodium aluminum hydride. Alkali metal hydrides are available commercially.

The alkylaluminum compound is according to the formula $R_xAlCl_{3-x}$, where R is alkyl having at least 5, alternatively from 5 to 20, alternatively from 6 to 10, alternatively 8 carbon atoms, x is an integer from 1 to 3, alternatively 3, alternatively 2, alternatively 1, and the alkylaluminum compound has a boiling point of at least 250° C.

Examples of alkyl groups represented by R include, but are not limited to, pentyl, cyclopentyl, 2-methylbutyl, 2-methylpentyl, hexyl, cyclohexyl, septyl, octyl, nonyl, decyl, and dodecyl.

Examples of the alkylaluminum compound include, but are not limited to, tripentyl aluminum, trihexyl aluminum, tricyclohexyl aluminum, triseptyl aluminum, trioctyl aluminum, tridecyl aluminum, dioctylaluminum chloride, and octyl aluminum dichloride, alternatively the alkylaluminum compound is trioctyl aluminum. Alkylaluminum compounds according to the invention are available commercially. The alkylaluminum compound may be a mixture of alkylaluminum compounds.

The alkylaluminum compound has a boiling point of at least 250° C., alternatively from 250° C. to 400° C., alternatively from 250 to 350° C., at at 101.3 kPa. One skilled in the art would know how to determine boiling point, and many of the boiling points are readily available in reference materials.

The contacting is done in the alkylaluminum compound, alternatively the alkylaluminum compound and a co-solvent. The co-solvent is any solvent that solubilizes and is unreactive with the perchloroneopentasilane, the alkali metal aluminum hydride, and the reaction product mixture. The co-solvent may not solubilize but may form a slurry with the alkali metal aluminum hydride. Examples of co-solvent included, but are not limited to, aromatic or non-aromatic cyclic or non-cyclic hydrocarbons including toluene, xylenes, trimethylbenzenes, isopropylbenzene, diisopropylbenzenes, heptanes, octanes, nonanes, decanes, dodecanes and cyclohexane, and polar aprotic solvents including diethyl ether, monoglyme and tetraglyme. The co-solvent has a boiling point different from neopentasilane.

The contacting is done in a reactor sufficient for the reduction of the perchloroneopentasilane. Examples of suitable reactors include a round bottom flask, a sealed tube reactor, a jacketed reactor, a Parr reactor, or larger scale reactors known in the art for such reactions. One skilled in the art would know how to select and appropriate reactor for the method of the invention.

The contacting is at conditions sufficient to form a reaction product mixture comprising neopentasilane. Conditions sufficient to form a reaction product mixture comprising neopentasilane are temperature and pressure conditions that will cause the reduction of the perchloroneopentasilane by the alkali metal aluminum hydride, alternatively at a temperature from −30 to 120° C., alternatively 40 to 100° C., alternatively 60 to 90° C., and a pressure from sub-atmospheric pressure to super-atmospheric pressure, alternatively at atmospheric pressure. One skilled in the art would know how to adjust and optimize temperature and pressure conditions for the contacting.

There is no required order of addition for the contacting, alternatively the alkali metal aluminum hydride is added to the alkylaluminum compound to form a alkali metal aluminum hydride and alkylaluminum compound mixture followed by addition of perchloroneopentasilane to the metal aluminum hydride and alkylaluminum compound mixture, alternatively the alkylaluminum compound, alkali metal aluminum hydride, and perchloroneopentasilane are added together at the same time. Contacting "in an alkylaluminum compound" means that the contacting is done in the presence of the alkyaluminum compound such that the alkylaluminum compound, the alkali metal aluminum hydride and the perchloroneopentasilane form a mixture, alternatively that the alkylaluminum compound acts as a solvent for the alkali metal aluminum hydride, the perchloroneopentasilane, or the alkali metal aluminum hydride and the perchloroneopentasilane.

The alkylaluminum and alkali metal aluminum hydride may be combined at a temperature from −30 to 120° C., alternatively from 40 to 100° C., alternatively 60 to 90° C., before contacting with the perchloroneopentasilane.

The alkylaluminum and alkali metal aluminum hydride may be combined at a pressure from sub-atmospheric pressure to super-atmospheric pressure, alternatively at atmospheric pressure before contacting with the perchloroneopentasilane.

The alkylaluminum and alkali metal aluminum hydride may be combined for greater than five seconds, alternatively from 5 minutes to 24 hours, alternatively from 30 minutes to 10 hours, alternatively from 1 hour to 5 hours before contacting with the perchloroneopentasilane.

Mixing may be used when combining the alkali metal aluminum hydride and the alkylaluminum compound, and when combining the alkali metal aluminum hydride and alkylaluminum compound mixture with the perchloroneopentasilane. One skilled in the art would understand how to combine the alkali metal aluminum hydride, the alkylaluminum compound, and the perchloroneopentasilane.

There is no particular rate of addition of the perchloroneopentasilane, alkali metal aluminum hydride, or the alkylaluminum compound except that the rate of addition should be controlled to maintain the temperature in the reactor within the ranges defined above.

The contacting of the alkylaluminum, alkali metal aluminum hydride, and the perchloroneopentasilane may be for greater than five seconds, alternatively from 5 minutes to 24 hours, alternatively from 10 minutes to 5 hours, alternatively from 30 minutes to 2 hours.

The contacting may be with mixing. The alkylaluminum compound and alkali metal aluminum hydride may be mixed before contacting with the perchloroneopentasilane and then mixed when contacting with the perchloroneopentasilane, alternatively the alkylaluminum compound, alkali metal aluminum hydride, and the perchloroneopentasilane are contacted in no particular order with mixing.

The perchloroneopentasilane is contacted at from 0.1 to 50% (w/w), alternatively from 0.5 to 30% (w/w), alternatively from 1 to 20% (w/w), based on the weight of the perchloroneopentasilane, the alkylaluminum compound, and the alkali metal aluminum hydride.

The alkylaluminum compound is contacted at from 20 to 98.8%, alternatively from 50 to 85% (w/w), alternatively from 65 to 85% (w/w), based on the weight of the perchloroneopentasilane, the alkylaluminum compound, and the alkali metal aluminum hydride.

The alkali metal aluminum hydride is contacted in a reductive effective amount. A "reductive effective amount" means an amount sufficient to reduce a substantial amount, alternatively >98% (w/w), alternatively >99% (w/w), alternatively >99.5% (w/w), alternatively 99.5 to 100% (w/w) of the perchloroneopentasilane to neopentasilane. One skilled in the art would know how to determine a reductive effective amount. In one embodiment, the alkali metal aluminum hydride is contacted at from 1 to 30% (w/w), alternatively from 2 to 20% (w/w), alternatively from 3 to 10% (w/w), based on the weight of the perchloroneopentasilane, the alkylaluminum compound, and the alkali metal aluminum hydride.

The reaction product mixture formed comprises neopentasilane, alternatively comprises neopentasilane, unreacted alkali metal aluminum hydride, alkali metal aluminum chloride, alkylaluminum compound, and byproducts. Neopentasilane has the formula $Si(SiH_3)_4$. The reaction product mixture may comprise from 0.1 to 25% (w/w), alternatively from 0.5 to 10% (w/w), alternatively from 1 to 5% (w/w) based on the weight of the neopentasilane unreacted alkali metal aluminum hydride, alkylaluminum compound, alkali metal aluminum chloride, and byproducts.

The % (w/w) of neopentasilane in the reaction product mixture can be measure by methods known in the art. For example, the % (w/w) of neopentasilane in the reaction product mixture may be determined by $^1H$ NMR. One skilled in the art would know how to determine the quantity of neopentasilane in the reaction product mixture by $^1H$ NMR. Procedures for $^1H$ NMR are known in the art.

The reaction product mixture is formed by contacting the alkali metal aluminum hydride, alkylaluminum compound, and perchloroneopentasilane as described above.

The neopentasilane is produced in greater than 50% yield, alternatively greater than 60% yield, alternatively from 50 to 100% yield, based on the moles of the starting reactants. One skilled in the art would know how to calculate % yield.

The neopentasilane is separated from the reaction product mixture to form a neopentasilane isolate. The neopentasilane isolate comprises the neopentasilane from the reaction product mixture, alternatively the neopentasilane isolate comprises the neopentasilane from the reaction product mixture and byproducts. the neopentasilane isolate comprises a greater percentage of the neopentasilane than the reaction product mixture.

The neopentasilane is separated from the reaction product mixture by methods known in the art to form the neopentasilane isolate, alternatively the neopentasilane is separated by contacting under vacuum, where the neopentasilane is separated by the vacuum as formed during the contacting to form the neopentasilane isolate, alternatively the neopentasilane is separated by contacting under vacuum, where the neopentasilane is separated by the vacuum as formed during the contacting, and condensing the vacuum separated neopentasilane in a cold trap, alternatively the neopentasilane is separated by contacting the alkali metal aluminum hydride, alkylaluminum compound, and perchloroneopentasilane under vacuum, where the neopentasilane is separated by the vacuum as formed, condensing and collecting the vacuum separated neopentasilane in a cold trap, and then distilling the condensed neopentasilane isolate collected in the cold trap. The distillation of the cold trap condensed neopentasilane may be using a Vigreux column under vacuum. One skilled in the art would know how to distill neopentasilane from the reaction product mixture and how to determine the appropriate vacuum to use.

The neopentasilane isolate comprises at least 70% (w/w), alternatively at least 80%, alternatively from 90 to 100%, alternatively from 98 to 100% (w/w) of neopentasilane based on the weight of the entire neopentasilane isolate. The % (w/w) of the neopentasilane in the neopentasilane isolate can be determined by $^1$H NMR as described above.

The neopentasilane isolate comprises less than 50 parts per billion (w/w) of aluminum, alternatively no detectable amount of aluminum, based on the entire neopentasilane isolate.

One skilled in the art would understand how to measure the amount of aluminum in the neopentasilane isolate. For example, the neopentasilane isolate may be digested in electronic grade tetramethylammonium hydroxide (25% (w/w) aqueous solution) containing less than 10 ppb of Al to form a silicate gel. The silicate gel is then digested with aqueous $HNO_3$ and HF. The digestion solution can then be analyzed by ICP-MS equipped with a 20 uL/min nebulizer to determine the aluminum content. Other test methods known in the art for determining aluminum content of a silane may be also used.

A method of depositing a silicon-containing film on a substrate, the method comprising, introducing neopentasilane produced by contacting perchloroneopentasilane with a reductive effective amount of an alkali metal aluminum hydride in an alkylaluminum compound of formula $R_xAlCl_{3-x}$, where R is alkyl having from at least 5 carbon atoms, x is an integer from 1 to 3, and the alkylaluminum compound has a boiling point of at least 250° C., at conditions sufficient to reduce the perchloroneopentasilane, to form a reaction product mixture comprising neopentasilane, and separating the neopentasilane from the product mixture to form a neopentasilane isolate, into a reactor with a substrate and, optionally, additional reactants under deposition sufficient conditions to form a silicon-containing film on the substrate.

The method of producing neopentasilane is as described above.

The neopentasilane may be introduced into the reactor by methods known in the art. One skilled in the art would know how to introduce the neopentasilane into the reactor.

The substrate is any substrate known in the art. For example, the substrate can be glass, silicon, metals, silicon nitride, silicon dioxide, or carbon. One skilled in the art would know substrates that may be used in deposition methods.

Additional reactants optionally may be added to the reactor with the neopentasilane, alternatively additional reactants are added to the reactor with the neopentasilane. Additional reactants include, but are not limited to oxygen, oxygen compounds, nitrogen, nitrogen compounds and plasma. One skilled in the art would know what additional reactants are added to deposit silicon-containing films onto a substrate.

The method of depositing the film is known in the art. Methods of depositing a silicon-containing film include, but are not limited to, atomic layer deposition (ALD), plasma enhanced atomic layer deposition (PEALD), plasma enhanced chemical vapor deposition (PECVD), and chemical vapor deposition (CVD).

The neopentasilane is introduced into the reactor and subjected to deposition sufficient conditions. "Deposition sufficient conditions" means conditions sufficient to deposit a silicon-containing layer on the substrate using neopentasilane. One skilled in the art would know the deposition sufficient conditions or easily determine the conditions required to deposit a silicon-containing film with neopentasilane.

Reactors for depositing silicon-containing films with neopentasilane are known in the art. One skilled in the art would know how to select a reactor to deposit a silicon-containing film from neopentasilane.

The method disclosed and claimed herein produced neopentasilane in good yield with low to no detectable amount of aluminum present in the neopentasilane. The neopentasilane produced may be used in methods of depositing silicon-containing films on a substrate.

EXAMPLES

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention. All percentages are in wt. % unless otherwise noted.

TABLE 1

| List of abbreviations used in the examples. | |
|---|---|
| Abbreviation | Word |
| g | gram |
| Me | methyl |
| wt | weight |
| % | percent |
| mol | mole |
| hr | hour |
| ° C. | degrees Celsius |
| NA | Not Applicable |
| mL | milliliters |

TABLE 1-continued

List of abbreviations used in the examples.

| Abbreviation | Word |
|---|---|
| Solids Content | (wt. of dried sample/wt. of initial sample) × 100 and determined as described below |
| cm | centimeter |

Example 1: Synthesis of Al-Free Neopentasilane (NPS)

High purity trioctylaluminum (126.2 g) was heated to 60° C. in a 500 ml round bottom flask. Lithium aluminum hydride (30.0 g) was quickly added to form a slurry. After the addition, the slurry was agitated for 3 hours at 60° C., and then, heated to 80° C. Perchloroneopentasilane (NPC; 6.1 g) was added at this temperature. After the addition, the reaction mixture was agitated for 30 minutes at 80° C. Crude NPS product (5.3 g) was removed from the reaction mixture under vacuum and condensed in a cold trap. The crude NPS product was analyzed with $^1$H NMR to contain 91 wt % NPS. The solution $^1$H NMR spectra were acquired on a MR-400 spectrometer in $C_6D_6$. The acquisition parameters include AT of 15, D1 of 120, PW of 2.567 and NT of 4.

The crude NPS (7.8 g) was distilled through a 6" Vigreux column under vacuum to yield a product (6.4 g). The distilled product (1.0) was reacted in 5.0 g electronic grade 25 wt % aqueous tetramethylammonium hydroxide (TMAH) solution to form 4.7 g silicate gel. The resultant silicate gel was digested in 18 ml concentrated $HNO_3$ and 5 ml concentrated HF solutions. The digestion solution was analyzed with ICP-MS equipped with a 20 uL/min nebulizer. The Al content was found to be less than 50 ppb (the detection limit) in the distilled NPS.

That which is claimed is:

1. A method of making neopentasilane, the method comprising:
   contacting perchloroneopentasilane with a reductive effective amount of an alkali metal aluminum hydride in an alkylaluminum compound of formula $R_xAlCl_{3-x}$, where R is alkyl having at least 5 carbon atoms, x is an integer from 1 to 3, and the alkylaluminum compound has a boiling point of at least 250° C., at conditions sufficient to reduce the perchloroneopentasilane, to form a reaction product mixture comprising the neopentasilane, and separating the neopentasilane from the reaction product mixture to form a neopentasilane isolate, wherein the reductive effective amount is sufficient to reduce more than 98% (w/w) of the perchloroneopentasilane to the neopentasilane.

2. A method according to claim 1, wherein the neopentasilane is separated from the reaction mixture by vacuum distillation to form the neopentasilane isolate.

3. A method according to claim 2, wherein the neopentasilane isolate is condensed in a cold trap.

4. A method according to claim 1, wherein the neopentasilane isolate comprises less than 50 ppb of aluminum.

5. A method according to claim 4, wherein the neopentasilane isolate comprises no detectable amount of aluminum.

6. A method according to claim 1, wherein the R has from 5 to 20 carbon atoms and x is 3.

7. A method according to claim 1, wherein the metal aluminum hydride is lithium aluminum hydride.

8. A method of depositing a silicon-containing film on a substrate, the method comprising, introducing neopentasilane produced by contacting perchloroneopentasilane with a reductive effective amount of an alkali metal aluminum hydride in an alkylaluminum compound of formula $R_xAlCl_{3-x}$, where R is alkyl having from at least 5 carbon atoms, x is an integer from 1 to 3, and the alkylaluminum compound has a boiling point of at least 250° C., at conditions sufficient to reduce the perchloroneopentasilane, to form a reaction product mixture comprising the neopentasilane, and separating the neopentasilane from the product mixture to form a neopentasilane isolate, into a reactor with a substrate and, optionally, additional reactants under deposition sufficient conditions to form a silicon-containing film on the substrate, wherein the reductive effective amount is sufficient to reduce more than 98% (w/w) of the perchloroneopentasilane to the neopentasilane.

9. A method according to claim 8, wherein the additional reactant is oxygen or nitrogen.

10. A method according to claim 8, wherein the silicon-containing film is deposited by ALD, PEALD, CVD or PECVD.

* * * * *